THRESHOLD CIRCUITS

Filed April 18, 1962 2 Sheets-Sheet 1

INVENTORS
BENJAMIN RABINOVICI &
CHARLES A. RENTON
BY
John V. Regan
Attorney

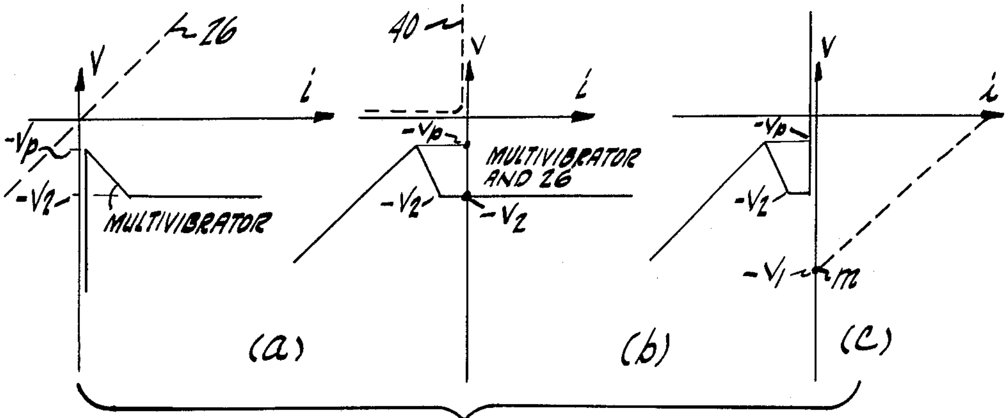
FIG. 4
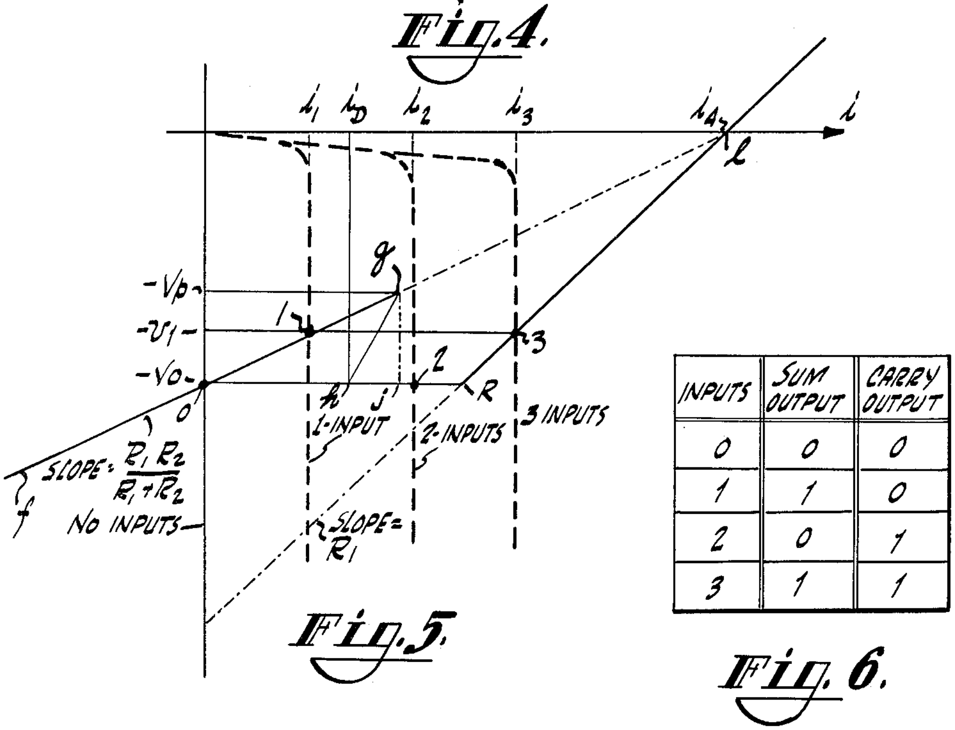
FIG. 5
| INPUTS | SUM OUTPUT | CARRY OUTPUT |
|---|---|---|
| 0 | 0 | 0 |
| 1 | 1 | 0 |
| 2 | 0 | 1 |
| 3 | 1 | 1 |
FIG. 6.
INVENTORS
BENJAMIN RABINOVICI &
CHARLES A. RENTON
BY
John V. Regan
Attorney United States Patent Office 3,253,133

Patented May 24, 1966

3,253,133

THRESHOLD CIRCUITS

Benjamin Rabinovici, Rego Park, and Charles A. Renton, New York, N.Y., assignors to Radio Corporation of America, a corporation of Delaware Filed Apr. 18, 1962, Ser. No. 188,475

4 Claims. (Cl. 235—176)

This invention relates in general to threshold circuits including negative resistance amplifier devices so connected as to present certain desired voltage current characteristics, and in particular to the use of such circuits in digital apparatus such as a binary adder.

There are a number of known two-terminal negative resistance diodes which provide a voltage-current characteristic including two positive resistance regions separated by a negative resistance region. One of the advantages in using two-terminal negative resistance devices for digital applications is the simplicity of the resulting circuits. However, it is difficult to arrange these prior circuits so that signal gain and isolation between the input and the output terminals is provided.

The possibility of constructing a two-terminal negative resistance circuit including two transistors has been described by J. J. Suran and F. A. Reibert in an article entitled "Two-Terminal Analysis and Synthesis of Junction Transistor Multivibrators" appearing in the March 1956 issue of IRE Transactions on Circuit Theory.

It is an object of this invention to provide improved threshold circuits using negative resistance characteristics of transistor amplifier circuits.

It is another object of this invention to provide an improvde binary adder employing a multivibrator circuit having a negative resistance region in its voltage-current characteristic and which provides gain and isolation between its input and its output.

An example of a negative resistance circuit useful in the present invention includes two transistors having input and output electrodes cross-coupled in the manner of a monostable multivibrator with one transistor normally biased to conduction and the other normally biased to non-conduction. The voltage-current (V-I) characteristic seen between the emitter of one of the transistors (the input transistor) and a circuit reference point is a voltage-current characteristic which includes a low-current-high-voltage peak, an intermediate-current negative resistance region and a high-current-low-voltage valley.

The high-current characteristic is modified by including a clamp diode in the collector circuit of the input transistor, flattening this portion of the V-I characteristic so that an increase of input current does not cause any further change in the voltage.

A threshold circuit according to the invention includes a negative resistance circuit such as the one previously described. The control circuit for the normally non-conducting transistor includes a first resistance, a nonlinear impedance, and a second resistance connected in series in that order. The junction between one of the resistances and the nonlinear impedance is connected to the normally non-conducting transistor. This control circuit together with the multivibrator provide a V-I characteristic such that a peak value of voltage occurs for one current value. A current increase above this value causes a sharp change of voltage from the peak value to a first value. This sharp change of voltage occurs at a defined value of input current and corresponds to the threshold value.

A feature of the invention is that the threshold circuit may be arranged to provide binary adder operation by connecting a second nonlinear impedance, such as a diode, in the output circuit of the normally non-conducting transistor. This second impedance further modifies the circuit V-I characteristic so that a second value of output voltage is produced for two or three increments of input current whereas the voltage output remains at the first value for a single current increment.

These and other objects and aspects of the invention will be apparent to those skilled in the art from the following detailed description taken in conjunction with the appending drawings, wherein:

FIGURE 4 shows the voltage-current characteristics of the multivibrator circuit as seen looking into terminals *a*, *b* and *e* of FIGURE 1;

FIGURE 5 shows the characteristic of the negative resistance circuit of FIGURE 1 looking into the circuit at terminal *d*, and it shows the characteristics of transistor 10 superimposed as a load line thereon; and, FIGURE 6 is a table that shows the Sum and Carry outputs of the circuit of FIGURE 1 as a function of the number of input terminals energized.

Figure 1:
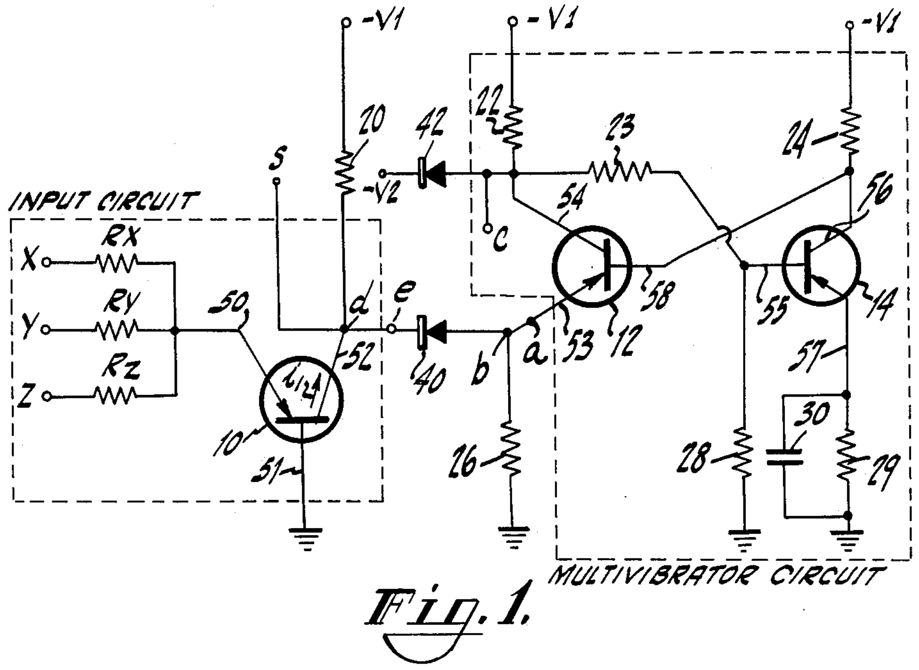
FIGURE 1 is a circuit diagram of a full-binary adder constructed according to the teachings of this invention.

The multivibrator circuit of FIGURE 1 comprises cross-coupled transistors 12 and 14. The base electrode 58 of transistor 12 is directly connected to the collector electrode 56 of transistor 14, and the base electrode 55 of transistor 14 is coupled through resistor 23 to the collector electrode 54 of transistor 12. A resistor 28 is connected between the base electrode 55 of transistor 14 and ground, and it forms a voltage divider with resistors 22 and 23, which are connected in a series circuit between the base electrode 55 and a bias potential $-V_1$. The voltage across resistor 28 biases transistor 14 to be normally conducting. Resistors 22 and 23 are also connected to the collector electrode 54 of transistor 12, so that when transistor 12 conducts the voltage at the base electrode 55 becomes more positive than the voltage at the emitter electrode 57 rendering the transistor 14 non-conducting.

The collector electrode 56 of transistor 14 is coupled through resistor 24 to the bias potential $-V_1$ and the emitter electrode 57 is coupled through resistor 29 to ground. A capacitor 30 is connected across resistor 29 to accelerate the switching time of transistor 14.

The emitter electrode 53 of transistor 12 is coupled through a resistor 26 to ground. The connection between the resistor 26 and the emitter electrode of transistor 12 is shown in FIGURE 1 as terminal *b* which is the input terminal of the multivibrator circuit.

Terminal C, the output terminal of the multivibrator circuit, is connected to the collector electrode 54 of transistor 12. When the circuit of FIGURE 1 is used as a binary adder, the carry output is derived at terminal C. A diode 42 is connected between a bias potential source $-V_2$ and the collector electrode 54 of transistor 12 so that there is no flow of current through the diode until the potential of collector electrode 54 becomes more positive than the potential $-V_2$.

The multivibrator circuit of FIGURE 1 is coupled to a control circuit including a resistor 26, diode 40, and resistor 20 connected in series between the bias potential source $-V_1$ and ground. Diode 40 is normally biased to conduct. The emitter of transistor 12 is connected at junction point *b* between resistor 26 and diode 40 of the control circuit.

Figure 2:
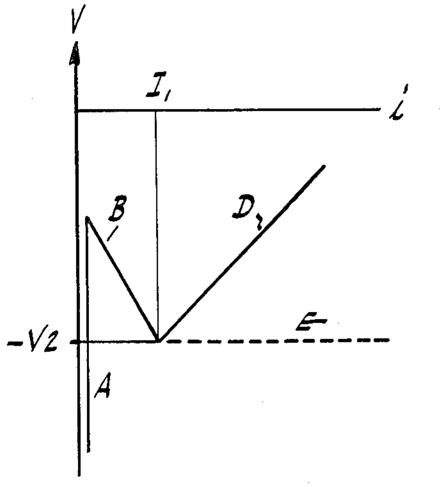
FIGURE 2 shows the voltage-current characteristic of the multivibrator circuit of FIGURE 1 looking into the multivibrator at a terminal *a* of FIGURE 1.
Figure 3:
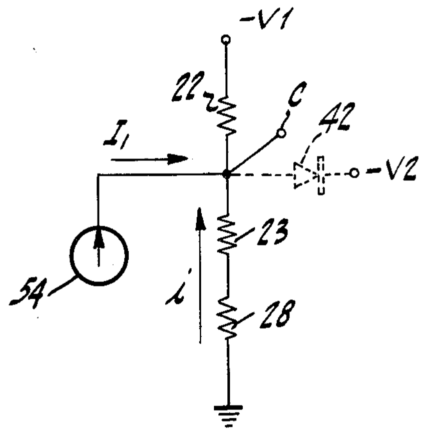
FIGURE 3 is a simplified circuit which will be referred to in describing how to calculate a region D of FIGURE 2.

Referring to FIGURE 2, there is shown the voltage-current characteristic of the multivibrator circuit taken at point *a* in the emitter circuit of transistor 12, that is, looking into the multivibrator circuit without taking into consideration the resistor 26 so that the V–I characteristic represents current flowing into the emitter electrode 53 of transistor 12 and the voltage between point *a* and ground. The solid line shows three linear regions A, B and D in which A is a constant current ($I \cong 0$) region, B is an intermediate-current, negative resistance region and D is a high-current positive resistance region. Diode 42 is not included in this circuit, however, when the diode 42 is included in the collector circuit of transistor 12, the linear region D is modified as shown by the dashed line representing the region E. This may be understood by referring to FIGURE 3 which shows the approximate equivalent circuit of the multivibrator with the load due to the transistors being neglected. When there is no current flow through the emitter circuit of transistor 12, the voltage at terminal C of FIGURE 3 is $-E_C = -V_1 + iR_3$ which is more negative than $-V_2$ so that the diode 42 is non-conductive. ($R_3$ is the resistance of resistor 22.) When current flows through the emitter of transistor 12 and hence through its collector, $-E_C = -V_1 + iR_3 + I_1R_3$; and when $E_C$ becomes more positive than $-V_2$, diode 42 conducts, clamping the value of the voltage of the collector of transistor 12 to a voltage $\cong -V_2$.

The solid curve in FIGURE 4*a* shows the characteristic of the multivibrator including the diode 42 as seen looking into terminal *a*. The dashed line in FIGURE 4*a* represents the characteristic of resistor 26. The impedance of the circuit looking into terminal *b* consists of resistor 26 connected in parallel with the multivibrator circuit of FIGURE 4*a*. The solid curve in FIGURE 4*b* shows the combination of the two curves in FIGURE 4*a*. The solid curve is obtained by summing up the parallel currents through the resistor 26 and the multivibrator circuit for given values of voltage. The dashed line of FIGURE 4*b* represents the characteristic of diode 40.

FIGURE 4*c* shows the V-I characteristic looking into terminal *e*, resulting from the addition of the series diode 40. Diode 40 is connected in series with the circuit having the characteristic of FIGURE 4*b*, so that in order to combine the two curves, the voltages across each one are added for the same value of the series current. This sum results in the solid curve of FIGURE 4*c*. The dashed line of FIGURE 4*c* represents the characteristic of resistor 20 and the bias supply $-V_1$. Looking into the circuit at terminal *d*, resistor 20 and supply voltage $-V_1$ are connected in parallel with the multivibrator circuit having the solid line characteristic of FIGURE 4*c*. By adding up the currents flowing through each of the two branches for given values of the voltage across them, the solid line of FIGURE 5 is obtained. This characteristic is the desired characteristic of the multivibrator circuit, as modified by the other elements in the circuit.

The V-I characteristic of the circuit seen looking at terminal *d* is shown in FIGURE 5 by the solid curve *fghjkl*. Region *fg* is a positive resistance region with a slope $$\frac{R_1R_2}{R_1+R_2}$$

determined by the parallel combination of the resistance $R_1$ of resistor 20 and the resistance $R_2$ of resistor 26.

Region *fg* intersects the voltage axis at a point 0 which has a magnitude of $-V_0$ volts, and represents the zero point of the system, i.e., when no input signal voltages are applied to input terminals X, Y and Z. $-V_0$ has approximately the value $-V_2$ if the voltage drops across diodes 40 and 42 and transistor 12 when in the saturation condition are neglected. The point 1 on region *fg* represents the stable operating point of the circuit when an input signal is applied to one of the input terminals X, Y and Z. Point 1 is obtained at the intersection of the V-I characteristic *fghjkl* and the characteristic of transistor 10 shown as a dashed curve. The coordinates of point 1 are $-v_1$, $i_1$. Point *g* corresponds to the peak voltage $-V_p$ of the V-I characteristic of the multivibrator circuit looking into terminal *a* of FIGURE 1. The extension of region *fg*, shown as a dotted line, intersects the current axis at a point 1.

Region *gh* corresponds to the negative resistance region B shown in FIGURE 2, and point *h* corresponds to the termination of the negative resistance region of the V-I characteristic of the multivibrator circuit as seen looking into terminal *a* as shown in FIGURES 2 and 4*a*. Region *gh* is a positive resistance region with a slope greater than the slope of region *fg*, and with a range of currents within the range of currents of region *fg* so that an equilibrium point cannot be reached in region *gh* with a transistor load, as illustrated in FIGURE 5.

Region *hjk* is an intermediate-current, constant-voltage region that results from the action of diode 42 and bias potential source $-V_2$ as previously explained. Point 2 on region *hjk* is the stable operating point when two input signal terminals are energized. Point 2 is obtained at the intersection of the V-I characteristic *fghjkl* and the characteristic of transistor 10 shown as a dashed curve in FIGURE 5. The coordinates of point 2 are $-V_0$, $i_2$, where $i_2 = 2i_1$.

Region *kl* is a positive resistance region with a slope $R_1$ determined by the resistance $R_1$ of resistor 20. The extension of region *kl* intersects the voltage axis at a point *m* which has a magnitude $-V_1$. Point 3 on region *kl* is the stable operating point when all three input terminals X, Y and Z are energized. Point 3 is obtained at the intersection of the V-I characteristic *fgjkl* and the characteristic of transistor 10 shown as a dashed curve in FIGURE 5. The coordinates of point 3 are $-v_1$, $i_3$, where $i_3 = 3i_1$.

The full binary adder circuit of FIGURE 1 is provided with an input circuit that includes three input signal terminals X, Y and Z and a transistor 10. The emitter electrode 50 of transistor 10 is coupled through resistors $R_x$, $R_y$ and $R_z$ to the input terminals X, Y and Z, respectively. The base electrode 51 of transistor 10 is connected to a reference potential shown in FIGURE 1 as ground. The collector electrode 52 of transistor 10 is coupled through resistor 20 to a source of bias potential $-V_1$, and the collector electrode 52 is connected at a point *d* between resistor 20 and diode 40 of the control circuit of the multivibrator. An output terminal S, from which the Sum output of the adder circuit is derived, is also connected to point *d*.

FIGURE 6 is a truth table that shows the relationship between the Sum and Carry outputs and the number of input terminals energized. In the input column of FIGURE 6, $0 = \bar{X}.\bar{Y}.\bar{Z}$; $1 = X + Y + Z$;

$$2 = X.(Y+Z) = Y.(X+Z) = Z.(X+Y)$$

$3 = X.Y.Z$, where X, Y and Z represent the voltages corresponding to binary ones to be added, and $\bar{X}$, $\bar{Y}$ and $\bar{Z}$ represent the voltages corresponding to binary zeros, the period (.) represents a logical "and" operation, and the plus sign (+) represents a logical "or" operation.

In operation, when no input signals are applied to the signal input terminals X, Y and Z the circuit looking into terminal *d* from the collector electrode 52 of transistor 10 is at the point 0 of its V-I characteristic as shown in FIGURE 5. Transistor 10 is non-conducting and there is no current flow into terminal *d*. FIGURE 5 shows that the V-I characteristic *fghjkl* intersects the voltage axis at point 0 because there is no load presented by transistor 10. Transistor 14 is biased to conduct by the voltage divider comprising resistors 22, 23 and 28, and the bias potential source $-V_1$. There is a current flow through resistor 26, diode 40, resistor 20 and bias potential $-V_1$, and the voltage at the emitter electrode 53 of transistor 12 is more negative than the voltage at the base electrode 58 of transistor 12, which is the same voltage as the voltage at collector electrode 56 of transistor 14, and hence transistor 12 is cut-off.

The voltage at collector electrode 54 of transistor 12, when transistor 12 is non-conducting, represents at terminal C a Carry output of binary zero. This is illustrated in FIGURE 6. The current $I_1$ flowing through resistor 26, diode 40 and resistor 20 into bias potential source $-V_1$ has a value $$\cong \frac{-V_1}{R_1+R_2}$$

where $R_1$ is the resistance of resistor 20 and $R_2$ is the resistance of resistor 26. The voltage at terminal $d$ is $$\frac{-V_1R_2}{R_1+R_2}=-V_0=-V_1+I_1R_1$$

Voltage $-V_0$ represents binary zero, so that the output at the output terminal S is a Sum output of binary zero, as illustrated in the table of FIGURE 6.

When an input signal is applied to one of the input signal terminals, to terminal X for example, transistor 10 is biased into conduction and a current $i_1$ flows through transistor 10 into terminal $d$. The circuit looking into terminal $d$ from the collector electrode of transistor 10 operates at the stable operating point 1 of its V-I characteristic, which results at the intersection of the V-I characteristic $fghjkl$ and the load $i_1$ presented by transistor 10 illustrated in FIGURE 5 as a dashed curve. The voltage at terminal $d$ is now $-v_1$ which is equal to $$-V_1+i_1R_1+I_1R_1$$

If as a matter of design, current $I_1$ is made equal to $2i_1$ then voltage $-v_1=-V_1+3i_1R_1$. Voltage $-v_1$ represents a binary one so that when an input signal is applied to one of the signal input terminals a Sum output of binary one is derived from terminal S. Transistors 12 and 14 remain in their former state so that the Carry output derived at terminal C is still a binary zero. This condition is illustrated in FIGURE 6.

When input signals are applied at the same time to two terminals, X and Y for instance, the circuit looking into terminal $d$ from the collector electrode 52 of transistor 10 changes its operation from point 0, the no input condition, to the stable operating point 2 on its V-I characteristic following a path $0gj2$. Stable operating point 2 occurs at the intersection of the $fghjkl$ V-I characteristic and the load $i_2$ presented by transistor 10. When the input signals are applied to terminals X and Y, transistor 10 is biased into conduction and current $i_2$ flows into terminal $d$. The current flowing through resistor 20, prior to the time when terminals X and Y are energized, is the current $I_1$ through diode 40. The increase of current flow through resistor 20 renders diode 40 non-conductive. The current flowing through the diode 40 prior to cut-off, flows through the emitter electrode 53 of transistor 12 rendering transistor 12 conductive. The bias voltage at the base electrode 55 of transistor 14 becomes more positive than the voltage at the emitter electrode 57 and transistor 14 is rendered non-conductive. The voltage at the collector electrode 54 of transistor 12 is clamped to a value $-V_2$. $-V_2$ represents a Carry output of binary one, which is derived from the Carry output terminal C, as shown in FIGURE 6.

The current flowing through resistor 20 now is $i_2$ which is equal to $2i_1$. The voltage at terminal S is $-V_1+2i_1R_1$ which is equal to $-V_0$ and represents a Sum output of binary zero.

When all three input terminals X, Y and Z are energized at the same time, the circuit looking into terminal $d$ from the collector 52 of transistor 10 changes its operation from point 0 to point 3 on its V-I characteristic following the path $0lgjk3$ (FIGURE 5). Point 3 occurs at the intersection of the $fghjkl$ V-I characteristic and the $i_3$ load presented by transistor 10, shown as a dashed curve in FIGURE 5.

By energizing the input terminals X, Y and Z the transistor 10 is biased into conduction. Current $i_3$ flows through the transistor 10 into terminal $d$. The increase of current through resistor 20 renders diode 40 non-conductive. The current $I_1$ previously flowing through the diode is diverted to the emitter electrode 53 of transistor 12 and the multivibrator circuit switches providing a Carry output of binary one. When diode 40 is cut-off the current flowing through resistor 20 is $i_3$ which is equal to $3i_1$. The voltage at terminal S is equal to $-V_1+3i_1R_1$ which is equal to $-v_1$. The Sum output derived at termial S is then a binary one as shown in FIGURE 6.

A typical circuit according to the invention may employ the following values of circuit components:

| | | |
|---|---|---|
| Resistors (ohms): | | |
| 20 | ohms | 6200 |
| 22 | do | 4700 |
| 23 | do | 4300 |
| 24 | do | 9100 |
| 26 | do | 6200 |
| 28 | do | 3600 |
| 29 | do | 3600 |
| Capacitors: | | |
| 30 | picofarads | 30 |
| Bias potentials: | | |
| $-V_1$ | volts | −24 |
| $-V_2$ | do | −12 |
| Transistors | | 2N404 |

What has been shown and described is an improved circuit employing a two terminal circuit or device that includes in the voltage-current characteristic presented at its input terminal a negative resistance region, and which is peculiarly suitable for digital application. The circuit described has the advantages of simplicity of design and provides gain and isolation between input and output, which are not ordinarily obtainable with other two terminal devices presenting a negative resistance region in its V-I characteristic.

Although the FIGURE 1 circuit has been described and illustrated employing PNP transistors, it will be understood that the circuit also can be implemented using other types of electron control devices. In particular, NPN transistors can be used instead of PNP transistors provided that the necessary changes, such as the polarity of the bias sources, are made. Also, the multivibrator circuit of FIGURE 1 can be replaced by a semiconductor device, such as a four layer diode for example, which exhibits a V-I characteristic similar to the characteristic shown in FIGURE 2.

What is claimed is:

1. A threshold circuit comprising in combination,
first and second cross-coupled transistors,
means for biasing said transistors to operate as a monostable multivibrator with said first transistor normally nonconducting and said second transistor normally conducting,
said first transistor having an input electrode for receiving applied signals and an output electrode,
said multivibrator exhibiting a voltage-current characteristic having a negative resistance region, and
a control circuit for altering said voltage-current characteristic to provide a peak threshold voltage point,
said control circuit including a first resistance, a nonlinear impedance, and a second resistance serially connected across said biasing means with the junction between one of said resistances and said nonlinear impedance being connected to the input electrode of said first transistor.

2. A binary adder comprising in combination,
first and second cross-coupled transistors,
means for biasing said transistors to operate as a monostable multivibrator with said first transistor normally nonconducting and said second transistor normally conducting,
said first transistor having input and output electrodes defining the input and output terminals of said multivibrator, a first diode coupled to the output terminal of said multivibrator, a control circuit including the series combination of a first resistor, a second diode, and a second resistor serially connected across said biasing means with the junction of said second diode and said second resistor connected to the input terminal of said multivibrator, a plurality of signal input terminals coupled to the junction of said first resistor and said second diode in said control circuit, and means providing a sum output terminal at the junction of said first resistor and said second diode, and a carry output terminal at the output terminal of said multivibrator.

3. A binary adder comprising in combination, first and second cross-coupled transistors, means for biasing said transistors to operate as a monostable multivibrator with said first transistor normally nonconducting and said second transistor normally conducting, said first transistor having an input electrode and an output electrode defining, respectively, the input and output terminals of said multivibrator, said multivibrator exhibiting a voltage-current characteristic having a negative resistance region, a first diode coupled to the output terminal of said multivibrator, a control circuit including a first resistor, a second diode, and a second resistor serially connected across said biasing means with the junction of said second diode and said second resistor connected to the input terminal of said multivibrator, said binary adder exhibiting a voltage-current characteristic having a low current positive resistance region, an intermediate current substantially constant voltage region, and a high current positive resistance region, means for applying input signals to said binary adder so that a first signal causes said binary adder to operate in said low current positive resistance region, a second signal causes said binary adder to operate in said substantially constant voltage region, and a third signal causes said binary adder to operate in said high current positive resistance region, and means for deriving a carry output from the output terminal of said multivibrator and a sum output from the junction of said first resistor and said second diode in said control circuit.

4. A full binary adder comprising in combination, first and second cross-coupled transistors, means for biasing said transistors to operate as a monostable multivibrator with said first transistor normally nonconducting and said second transistor normally conducting, said first transistor having input and output electrodes defining the input and output terminals of said multivibrator, a first diode coupled to the output terminal of said multivibrator, a control circuit including a first resistor, a second diode, and a second resistor serially connected across said biasing means with the junction of said second diode and said second resistor coupled to the input terminal of said multivibrator, an input transistor having an input electrode, and an output electrode coupled to the junction of said first resistor and said second diode in said control circuit, three signal input terminals coupled to the input electrode of said input transistor, and means for deriving a carry output from the output terminal of said multivibrator and a sum output from the output electrode of said input transistor.

References Cited by the Examiner

UNITED STATES PATENTS

| | | | |
|---|---|---|---|
| 3,014,663 | 12/1961 | Horton et al. | 235—176 |
| 3,018,981 | 2/1962 | Lewin | 235—176 |
| 3,040,189 | 6/1962 | Cramer. | |
| 3,156,816 | 11/1964 | Kosonochy | 235—172 |

OTHER REFERENCES

Ryder, J. D.: Engineering Electronics, New York, McGraw-Hill, 1957, pages 290–298.

Suran, J. J., and Reibert, F. A.: "Two Terminal Analysis and Synthesis of Junction Transistor Multivibrators," IRE Transactions on Circuit Theory, March 1956.

ROBERT C. BAILEY, *Primary Examiner.*

MALCOLM A. MORRISON, *Examiner.*

E. M. RONEY, T. M. ZIMMER, *Assistant Examiners.*